(12) United States Patent
Zeng et al.

(10) Patent No.: US 9,305,887 B2
(45) Date of Patent: Apr. 5, 2016

(54) SEAL RING STRUCTURE WITH A V-SHAPED DIELECTRIC LAYER CONFORMALLY OVERLAPPING A CONDUCTIVE LAYER

(71) Applicant: UNITED MICROELECTRONICS CORP., Hsin-Chu (TW)

(72) Inventors: Fan-Qing Zeng, Singapore (SG); Ching Hwa Tey, Singapore (SG); Xiaoqing Xu, Singapore (SG)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 24 days.

(21) Appl. No.: 13/911,062

(22) Filed: Jun. 5, 2013

(65) Prior Publication Data

US 2014/0361438 A1    Dec. 11, 2014

(51) Int. Cl.
*H01L 23/58*    (2006.01)
*H01L 23/00*    (2006.01)

(52) U.S. Cl.
CPC ............ *H01L 23/585* (2013.01); *H01L 23/564* (2013.01); *H01L 2924/0002* (2013.01)

(58) Field of Classification Search
USPC ......... 257/774, 700, 758, 759, 773, 775, 776, 257/786
See application file for complete search history.

(56) References Cited

U.S. PATENT DOCUMENTS

| | | | |
|---|---|---|---|
| 5,414,297 A * | 5/1995 | Morita et al. | 257/620 |
| 5,776,826 A | 7/1998 | Mitwalsky | |
| 6,753,608 B2 | 6/2004 | Tomita | |
| 6,998,712 B2 * | 2/2006 | Okada et al. | 257/758 |
| 2006/0145347 A1 | 7/2006 | Aida | |

* cited by examiner

*Primary Examiner* — A. Sefer
*Assistant Examiner* — Dilinh Nguyen
(74) *Attorney, Agent, or Firm* — Winston Hsu; Scott Margo

(57) ABSTRACT

A method of forming a seal ring structure includes the following steps. A substrate is provided, and the substrate includes a seal ring region. A metal stack is formed in the seal ring region. A first dielectric layer covering the metal stack is formed. A part of the first dielectric layer is removed to form an opening to expose the metal stack, and at least a side of the opening is not perpendicular to a top surface of the first dielectric layer. A conductive layer is formed to fill the opening. A second dielectric layer is formed to continuously cover the first dielectric layer and the conductive layer, and the second dielectric layer has a v-shaped surface totally overlapping the conductive layer.

8 Claims, 10 Drawing Sheets

US 9,305,887 B2

SEAL RING STRUCTURE WITH A V-SHAPED DIELECTRIC LAYER CONFORMALLY OVERLAPPING A CONDUCTIVE LAYER

BACKGROUND OF THE INVENTION

1. Field of the Invention

The present invention relates to a method of forming a seal ring structure, and more particularly, to a method of forming a seal ring structure having a v-shaped dielectric layer conformally and totally overlapping a conductive layer, which may serve as a protective structure for an integrated circuit region.

2. Description of the Prior Art

In order to protect a region of a semiconductor device in which an integrated circuit is formed (hereinafter referred to as an "integrated circuit (IC) region") from being affected by moisture and ions contained in an ambient air, a protective structure called a "seal ring", "die edge seal", or "guard ring" is provided on an inner side of a scribe line, that is, in the vicinity of an edge portion of a chip (die). In a high-productivity process, a typical seal ring is formed of interconnect layers and contacts made of materials in the same manner as the integrated circuit (IC) region of the semiconductor device, and surrounds the integrated circuit (IC) region.

As to the protective structure, a metal layer such as an aluminum metal layer can be additionally disposed on the interconnect layers to improve the strength of the protective structure. However, with the trend of miniaturization of the electronic products, as the metal layer is predetermined to fill an opening partially exposing the interconnect layers, the small critical dimension of the interconnect layers may shrink the size of the opening, and the overhang defect may be formed during the formation of the metal layer, which may damage the thickness uniformity of the film such as a redistribution layer (RDL) that is later formed on the overall wafer through sputtering process. Consequently, how to avoid the formation of the overhang defect in the metal layer of the protective structure is still an important issue in the field.

SUMMARY OF THE INVENTION

An objective of the present invention is therefore to provide a method of forming a seal ring structure in order to avoid the formation of the overhang defect in a conductive layer disposed in a seal ring structure, and enhance the structural completeness of the conductive layer.

According to one exemplary embodiment of the present invention, a method of forming a seal ring structure includes the following steps. A substrate is provided, and the substrate includes a seal ring region. A metal stack is formed in the seal ring region. A first dielectric layer covering the metal stack is formed. A part of the first dielectric layer is removed to form an opening to expose the metal stack, and at least a side of the opening is not perpendicular to a top surface of the first dielectric layer. A conductive layer is formed to fill the opening. A second dielectric layer is formed to continuously cover the first dielectric layer and the conductive layer, and the second dielectric layer has a v-shaped surface totally overlapping the conductive layer.

During the etching processes performed to remove a part of the first dielectric layer to form the opening, a gas ratio of the etchant is modified to optimize the profile of the opening. Therefore, at least a side of the opening is tilted or includes a concave-curved side. In other words, a width of the opening may increase from a bottom to a top of the opening. Furthermore, the conductive layer filling the opening may include two convex-curved parts toward different directions above the first dielectric layer instead of common vertical corners. The second dielectric layer may conformally cover the conductive layer and induce a v-shaped surface just on the conductive layer. Consequently, the overhang defect can be avoided, the coverage rate of the second dielectric layer and the thickness uniformity of the film later formed by sputtering process can be further improved, and the completeness of the seal ring structure can be achieved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
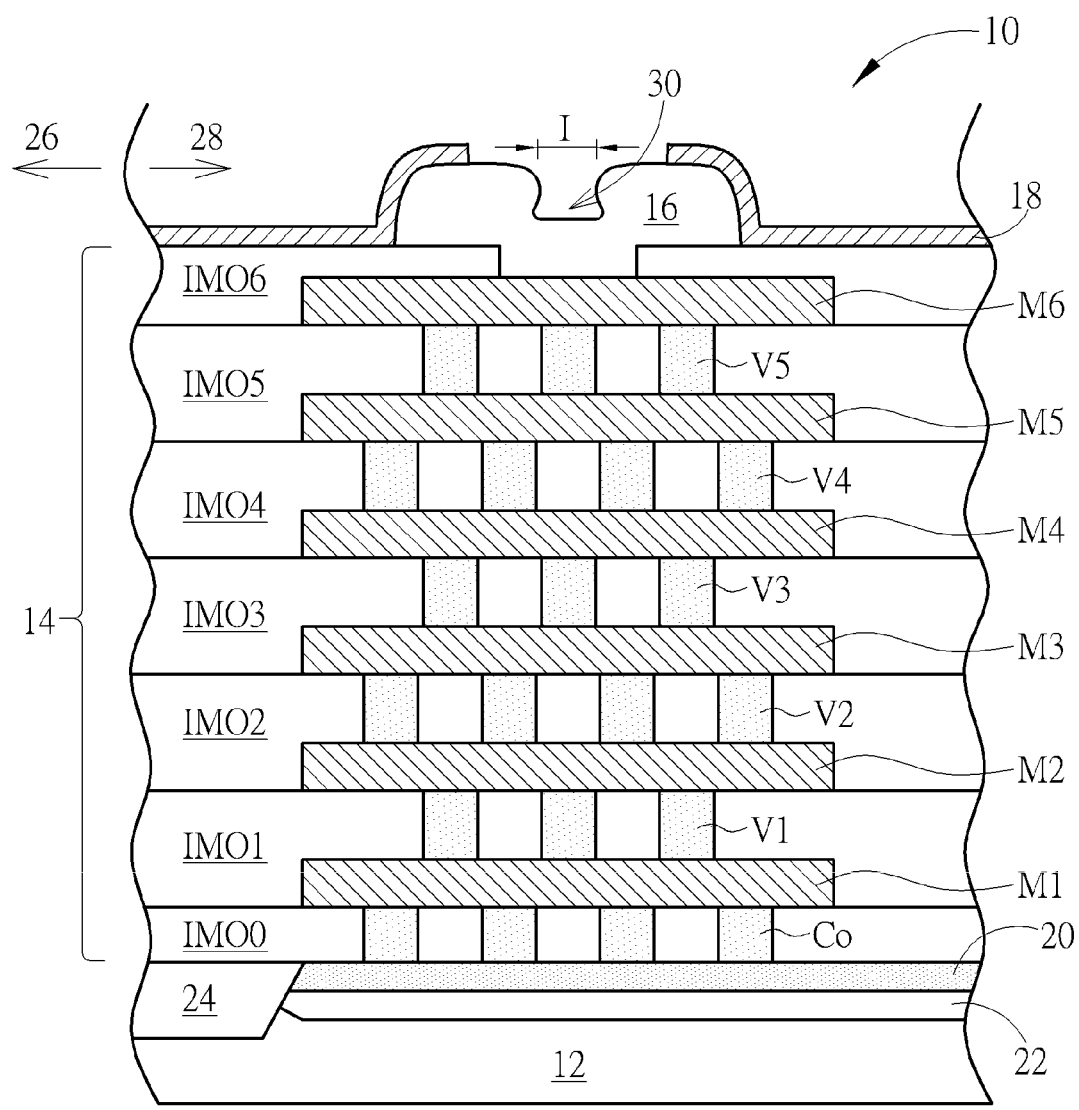
FIG. 1 through FIG. 2 are schematic diagrams illustrating a seal ring structure according to a first exemplary embodiment of the present invention.
Figure 2:
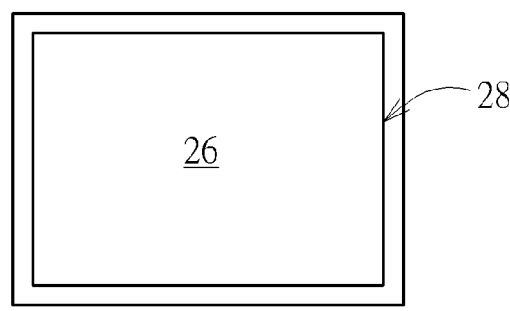

Please refer to FIG. 1 through FIG. 2, which are schematic diagrams illustrating a seal ring structure according to a first exemplary embodiment of the present invention. As shown in FIG. 1 and FIG. 2, the seal ring 10 includes a stack of metal/contact/via layers 14 (including metal layers M1-M6, via layers V1-V5, a contact metal layer Co, and inter-metal oxide layers IMO0-IMO6) disposed on the silicon substrate 12 in the seal ring region 28. Furthermore, a passivation layer 18 partially exposes the conductive layer 16 at the top, in which the exposed conductive layer 16 could be electrically connected to ground to enhance the insulation effect. A salicide layer 20 and a P+ doped region 22 are disposed below the contact metal layer Co and adjacent to a shallow trench isolation (STI) 24. The seal ring 10 provides a boundary around the entire integrated circuit (IC) region 26 as shown in FIG. 2. This boundary forms an impervious wall in the die around the IC region 26, thereby, preventing ionic contamination and moisture from penetrating into the IC region 26.

However, the exposed conductive layer 16 may be damaged by the clean solutions, etchants, and chemical solvents used in the later processes such as redistribution layer (RDL) processes. In addition, the vertical sides between the conductive layer 16 and the inter-metal oxide layer IMO6 may make the protrusions of the conductive layer 16 close to each other and shorten the interval I between the protrusions of the conductive layer 16, which may induce a seam 30, and deteriorate the coverage rata of the later deposited film such as redistribution layer on the conductive layer 16.

Figure 3:
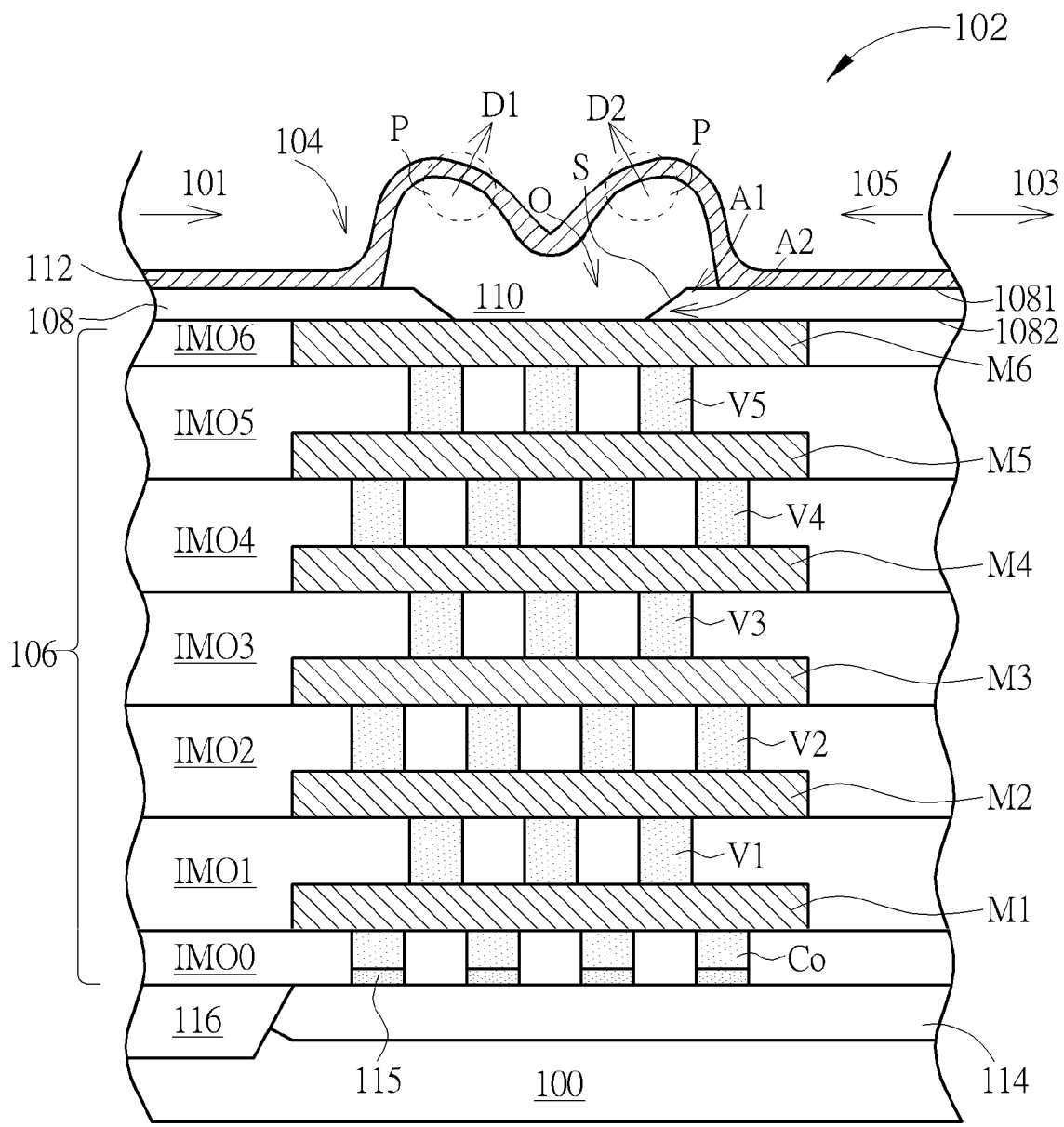
FIG. 3 is a schematic diagram illustrating a seal ring structure according to a second exemplary embodiment of the present invention.

In order to avoid the seam formation and improve the coverage rate of the later deposited films, the profile of the conductive layer 16 needs to be optimized. Please refer to FIG. 3, which is a schematic diagram illustrating a seal ring structure according to a second exemplary embodiment of the present invention. As shown in FIG. 3, a seal ring structure 102 includes at least a metal stack 104, a first dielectric layer 108, a conductive layer 110 and a second dielectric layer 112 sequentially disposed on a substrate 100. The seal ring structure 102 is located in a seal ring region 101 on an inner side of a scribe line 103, that is, in the vicinity of an edge portion of a chip (die) 105. The metal stack 104 includes metal layers M1-M6, via layers V1-V5, and a contact metal layer Co. The number of metal stacks, and the number of metal layers and the number of via layers in each metal stack are not limited thereto. Furthermore, the metal stack 104 is surrounded by a dielectric layer 106 on the substrate 100, and the dielectric layer 106 includes inter-metal oxide layers IMO0-IMO6. In order to reduce the electrical coupling noise, a P+ doped region 114 can be selectively disposed under the metal stack 104 adjacently to the shallow trench isolation (STI) 116. The P+ doped region 114 can be electrically connected to the contact metal layer Co through a selectively disposed metal silicide layer 115 totally overlapped by the contact metal layer Co or a selectively disposed metal silicide layer totally overlapping the P+ doped region 114 which is similar to the salicide layer 20 as shown in FIG. 1. The STI 116 is disposed at least at one side of the metal stack 104 and may extend under the metal stack 104. In other words, a part of the STI may be disposed under the metal stack 104. The disposition and the arrangement of the P+ doped region 114 and the STI 116 can be modified according to process demands.

The first dielectric layer 108 disposed on the metal stack 104 and the dielectric layer 106 may include a single-layered structure or a multi-layered structure, and a thickness of the first dielectric layer 108 is substantially smaller than 10000 Angstroms (Å), and is preferably between 6000 Å and 8000 Å. The material of the first dielectric layer 108 includes dielectric material such as silicon oxide (SiO), silicon nitride (SiN), silicon oxynitride (SiON) or a combination thereof. In this exemplary embodiment, the first dielectric layer 108 made of silicon oxide (SiO) has a thickness around 7000 Angstroms (Å).

The conductive layer 110 disposed on the first dielectric layer 108 fills an opening O in the first dielectric layer 108 (i.e. the conductive layer 110 fills the disjointed space within the non-continuous first dielectric layer 108) and partially overlaps the first dielectric layer 108 at two sides of the opening O. That is, a bottom of the conductive layer 110 may directly contact a top of the metal stack 104 (i.e. the top metal layer M6) exposed by the opening O of the first dielectric layer 108, and cover a top surface 1081 of the first dielectric layer 108 at two sides of the opening O. The material of the conductive layer 110 includes conductive material, and in this exemplary embodiment, the conductive layer 110 is made of aluminum (Al). It is appreciated that, at least a side S between the first dielectric layer 108 and the conductive layer 110 is tilted, and is not perpendicular to the top surface 1081 of the first dielectric layer 108. An included angle A1 between the side S and the top surface 1081 of the first dielectric layer 108 is substantially larger than 90 degrees, and an included angle A2 between the side S and a bottom surface 1082 of the first dielectric layer 108 could be substantially equal to or smaller than 90 degrees. Furthermore, a top of the conductive layer 110 opposite to the side S may include two convex-curved parts P above the first dielectric layer 108, wherein the convex-curved parts P have different protruding directions D1/D2, in which the protruding directions D1/D2 are not directed toward the substrate 100 and are not parallel to each other, in order to avoid the formation of the overhang which may cause seam or void defects within the conductive layer 110, and improve the thickness uniformity of the film later formed on the overall wafer through sputtering process.

In addition, the second dielectric layer 112 disposed on the conductive layer 110 is a continuous film in the seal ring region 101 that totally covers the conductive layer 110 in order to protect the integrity of the conductive layer 110. The second dielectric layer 112 may include a single-layered structure or a multi-layered structure, and a thickness of the second dielectric layer 112 is substantially smaller than the thickness of the first dielectric layer 108. The material of the second dielectric layer 112 includes dielectric material such as silicon oxide (SiO), silicon nitride (SiN), silicon oxynitride (SiON) or a combination thereof. In this exemplary embodiment, the second dielectric layer 112 includes a multi-layered structure made of silicon oxide (SiO) and silicon nitride (SiN).

Figure 4:
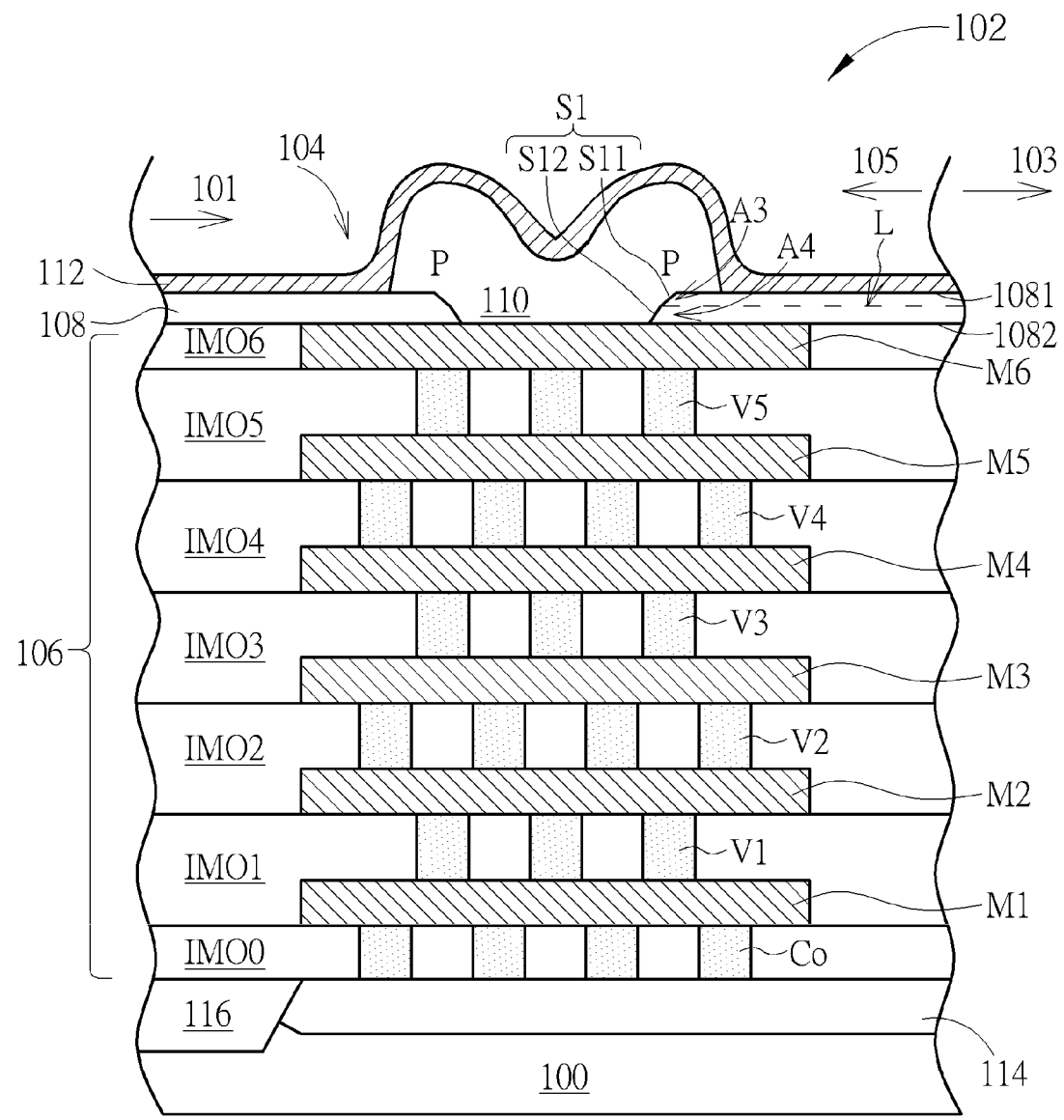
FIG. 4 is a schematic diagram illustrating a seal ring structure according to a third exemplary embodiment of the present invention.

The profile of the opening O in the first dielectric layer 108 which affects the shape of the conductive layer 110 to avoid the overhang formation is not limited to the one illustrated above. Please refer to FIG. 4, which is a schematic diagram illustrating a seal ring structure according to a third preferred exemplary embodiment of the present invention. In another exemplary embodiment, as shown in FIG. 4, at least a side S1 between the first dielectric layer 108 and the conductive layer 110 includes various tilt angles. In other words, the side S1 does not include only one line segment, but include several sub sides having different inclination degrees. For example, the side S1 includes at least an upper side S11 and at least a lower side S12, and the upper side S11 is disposed on the lower side S12. In this exemplary embodiment, an included angle A3 between the upper side S11 and a line L parallel to the surface of the substrate 100 substantially around 85 degrees is smaller than an included angle A4 between the lower side S12 and the bottom surface 1082 of the first dielectric layer 108 substantially around 89 degrees. In other words, a slope of the upper side S11 is substantially smaller than a slope of the lower side S12, i.e. the lower side S12 is more oblique than the upper side S11. The side S1 preferably includes decreasing tilt angles from the bottom surface 1082 of the first dielectric layer 108 to the top surface 1081 of the first dielectric layer 108, and the included angles A3/A4 preferably range between 85 and 90 degrees. In other exemplary embodiment, the bottom width of the opening could also be increased as well to avoid the overhang formation.

Figure 5:
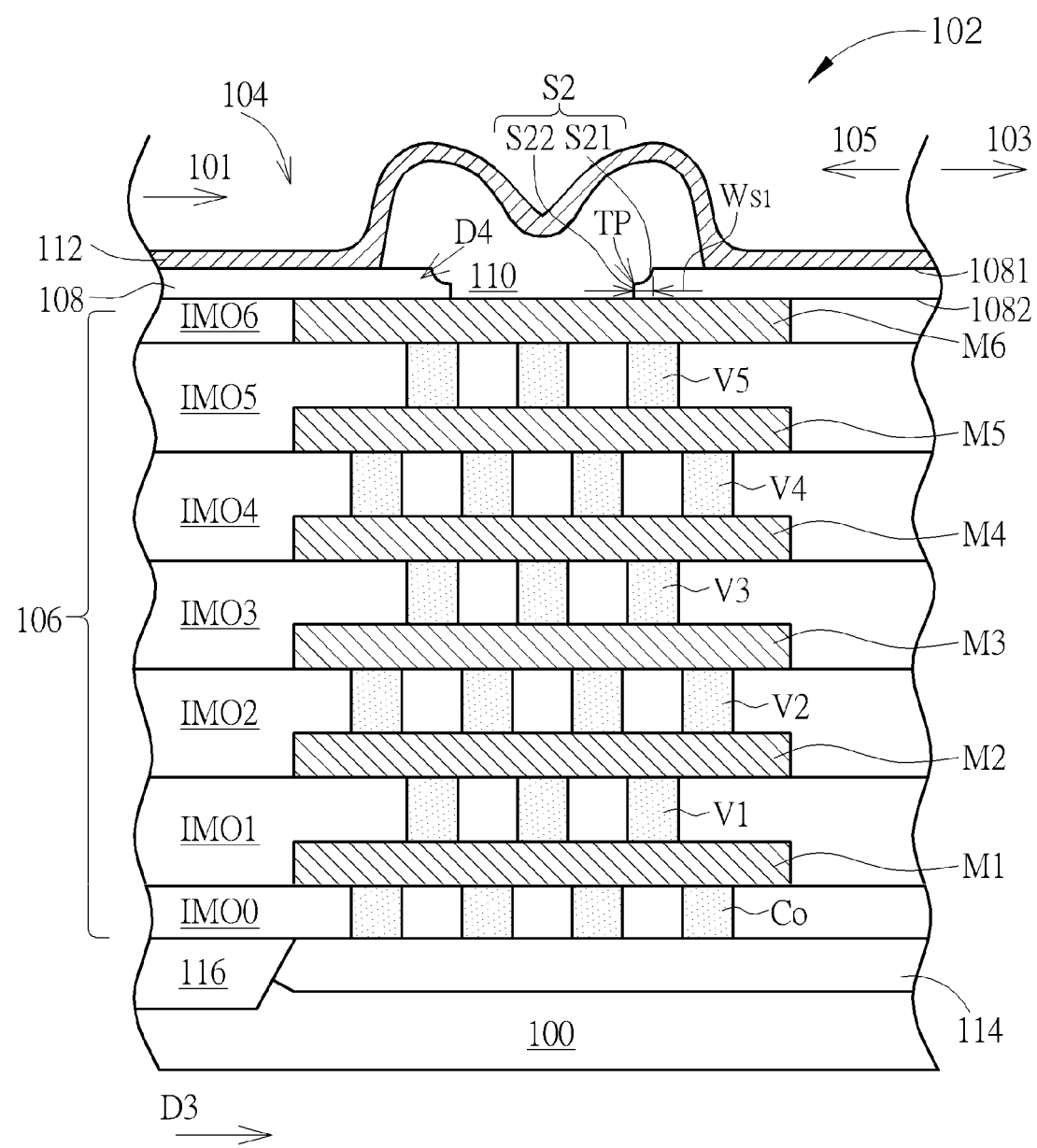
FIG. 5 is a schematic diagram illustrating a seal ring structure according to a fourth preferred exemplary embodiment of the present invention.

Please refer to FIG. 5, which is a schematic diagram illustrating a seal ring structure according to a fourth preferred exemplary embodiment of the present invention. In another exemplary embodiment, as shown in FIG. 5, at least a side S2 between the first dielectric layer 108 and the conductive layer 110 includes at least a concave-curved side such as a concave-curved side including at least two different values of curvature. In other words, the side S2 may include one curved side or several sub sides having different shapes. For example, the side S2 includes at least an upper side S21 and at least a lower side S22, and the upper side S21 is disposed on the lower side S22. A shape of the upper side S21 is different from a shape of the lower side S22; therefore, a twist point TP is formed at the boundary of the upper side S21 and the lower side S22, and a curvature of the upper side S21 is substantially larger than a curvature of the lower side S22. In this exemplary embodiment, the curvature of the upper side S21 is substantially around 1, and the curvature of the lower side S22 is substantially around 0, in other words, the shape of the upper side S21 is similar to a quarter circle, i.e. the upper side S21 could be a curved side, and the shape of the lower side S22 is similar to a line segment, i.e. the lower side S22 could be a linear side. Furthermore, the projected length $W_{S1}$ of the upper side S21 along a horizontal direction D3 on the bottom surface 1082 of the first dielectric layer 108 is substantially larger than the projected length of the lower side S22 along the horizontal direction D3 on the bottom surface 1082 of the first dielectric layer 108 (as the lower side S22 is a linear side, the projected length is substantially around 0). The upper side S21 is preferably a concave-curved side; in other words, the upper side S21 is a curved side having a curved direction D4 toward the substrate 100.

Moreover, a projected length of a width of a top of the conductive layer 110 along the horizontal direction D3 on the bottom surface 1082 of the first dielectric layer 108 is substantially larger than a width of a bottom of the conductive layer 110 (i.e. a width of a bottom of the opening O). The part where the side S1/S2 of the conductive layer 110 contacts the first dielectric layer 108 has a half-Y shaped profile; in other words, the side S1/S2 of the first dielectric layer 108 provides a concave-curved profile instead of a common vertical profile, therefore, excessive stress may be prevented from being accumulated at the corner of the first dielectric layer 108, thereby reducing cracks formation in the conductive layer 110 covering the first dielectric layer 108. Furthermore, the modified profile of the opening of the first dielectric layer 108 facilitates the proper profile of the top the conductive layer 110 to avoid the occurrence of overhang.

Figure 6:
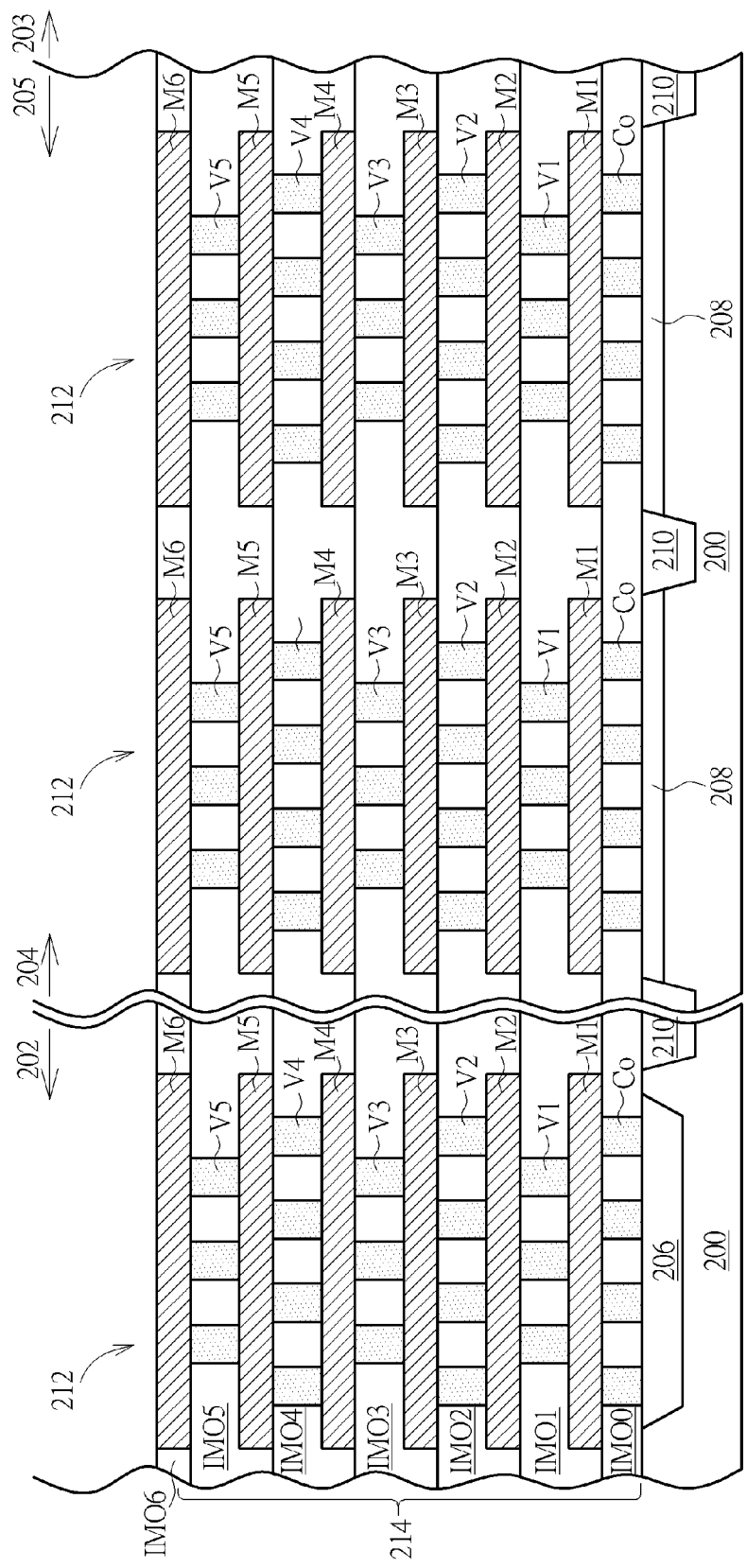
FIG. 6 through FIG. 11 are schematic diagrams illustrating a method of forming a seal ring structure according to a preferred exemplary embodiment of the present invention.

The present invention provides a method of forming a seal ring structure as illustrated above. Please refer to FIG. 6 through FIG. 10, which are schematic diagrams illustrating a method of forming a seal ring structure according to a preferred exemplary embodiment of the present invention. As shown in FIG. 6, a substrate 200 is provided, and the substrate 200 includes an integrated circuit region 202 and a seal ring region 204, in which the seal ring region 204 surrounds the integrated circuit region 202. More specifically, the integrated circuit region 202 is located in the center portion of a chip (die) 205, and the seal ring region 204 is located in the vicinity of an edge portion of the chip (die) 205, i.e. on an inner side of a scribe line 203. The substrate 200 may include at least a conductive region 206 and/or other semiconductor elements (not shown) disposed in the integrated circuit region 202. The substrate 200 may be a substrate composed of silicon, gallium arsenide (GaAs), silicon on insulator (SOI) layer, epitaxial layer, SiGe layer or other semiconductor materials. The conductive region 206 could be of any kind of conductive elements, including gate electrodes, drain electrodes, source electrodes, conductive lines, or metal contacts, etc. Furthermore, a material of the conductive region 206 may include doped semiconductor material, metal silicide, or metal. Moreover, the conductive region 206 could also be disposed on the substrate 200 or in a dielectric layer (not shown) disposed on the substrate 200. Furthermore, at least a conductive region 208 could be selectively disposed in the substrate 200 adjacently to the shallow trench isolation (STI) 210 in the seal ring region 204. The conductive region 208 in the seal ring region 204 could include doped semiconductor material, metal silicide, or metal, for example, a P+ doped region with a metal silicide layer disposed thereon.

A plurality of metal stacks 212 including metal layers M1-M6, via layers V1-V5, and a contact metal layer Co are respectively formed in the integrated circuit region 202 and the seal ring region 204. The number of metal stacks in the integrated circuit region 202 and the seal ring region 204, the number of metal layers and the number of via layers in each metal stack could be modified according to process requirements. Furthermore, the metal stacks 212 are surrounded by a dielectric layer 214 on the substrate 200, and the dielectric layer 214 includes the corresponding inter-metal oxide layers IMO0-IMO6. In order to enhance productivity, the processes of forming the conductive region 206/208, the shallow trench isolation (STI) 210, the metal stacks 212 and the dielectric layer 214 in the integrated circuit region 202 and the seal ring region 204 can be integrated together. As the processes of manufacturing the conductive region, the shallow trench isolation (STI), the metal stacks and the dielectric layer are known to those skilled in the art, the details are omitted herein for brevity.

Figure 7:
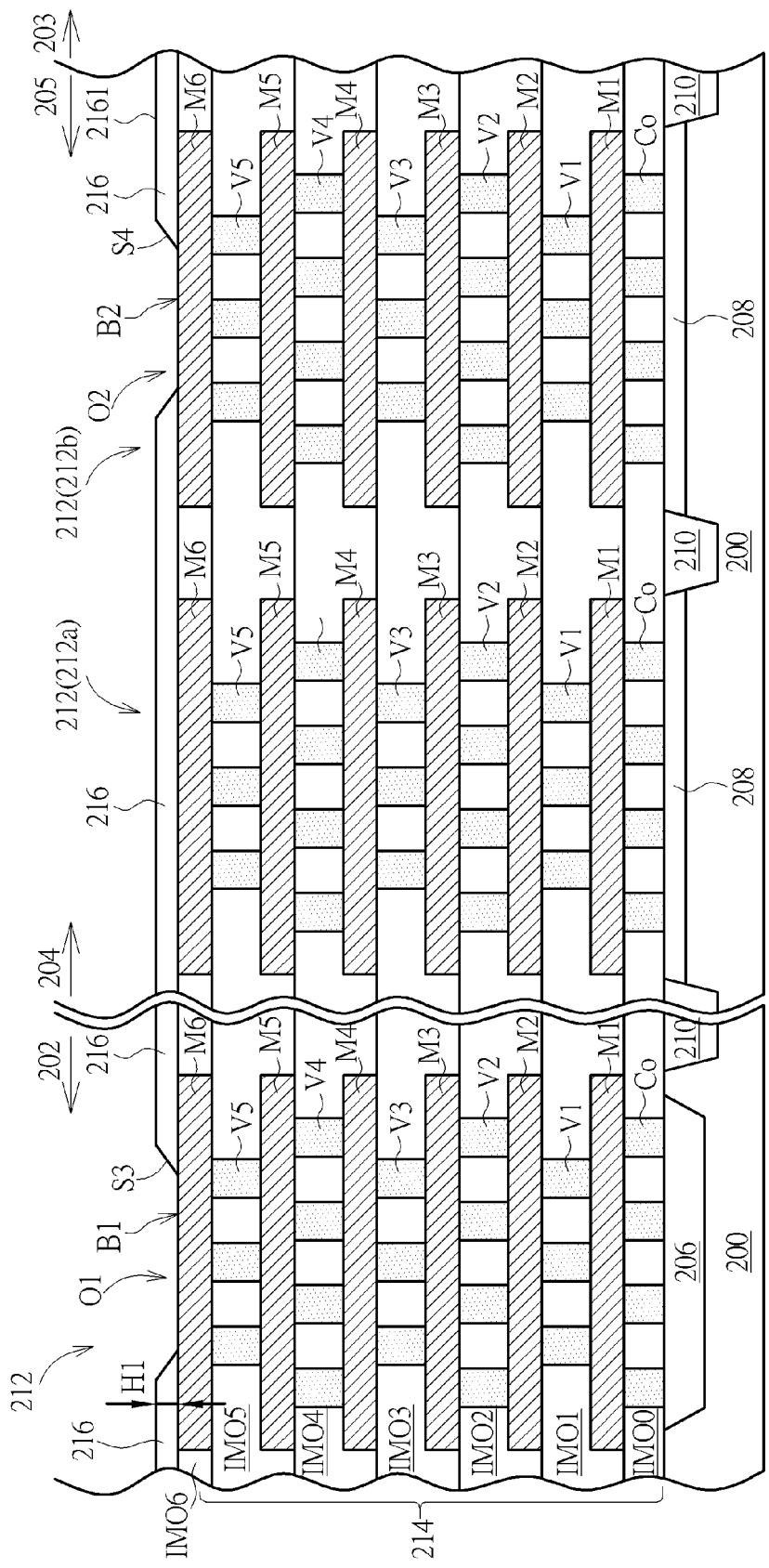

As shown in FIG. 7, a first dielectric layer 216 is formed on the substrate 200 to cover the metal stacks 212 in the integrated circuit region 202 and the seal ring region 204. The first dielectric layer 216 provides insulation properties, or serves as a passivation layer on the metal stacks 212 and the dielectric layer 214. The first dielectric layer 216 can be made of dielectric materials such as silicon oxide (SiO), silicon nitride (SiN), silicon oxynitride (SiON) or a combination thereof through a chemical vapor deposition (CVD) process or other suitable processes. A thickness H1 of the first dielectric layer 216 is substantially smaller than 10000 Angstroms (Å), and preferably between 6000 Å and 8000 Å. In this exemplary embodiment, the first dielectric layer 216 made of silicon oxide (SiO) has a thickness around 7000 Angstroms (Å).

Furthermore, a photolithography process and an etching process are performed to remove a part of the first dielectric layer 216 to respectively form at least an opening O1/O2 in the integrated circuit region 202/the seal ring region 204, and the formed openings O1/O2 may expose the top metal layer M6 of the metal stack 212. The photolithography process is performed to form a photoresist layer (not shown) on the first dielectric layer 216 to serve as a mask, and the photoresist layer is used to define the shape, the size and/or the location of the later formed openings O1/O2. In this exemplary embodiment, the opening O1 in the integrated circuit region 202 is predetermined to have a square-shaped pattern with a side of 2.7 micrometers (μm), and the opening O2 disposed in the seal ring region 204 only exposes the outer metal stacks 212b without exposing the inner metal stacks 212a, and is predetermined to have a rectangle-shaped pattern with one side of 1.8 micrometers (μm) and another side of a chip girth. Moreover, the etching process may include a dry etching process or a wet etching process. In a preferred embodiment, the etchant used in the etching process includes carbon (C)-containing gas and fluorine (F)-containing gas to effectively modify the profiles of the openings O1/O2. More specifically, the gas ratio of the carbon-containing gas to the fluorine-containing gas gradually changes during the etching process, so that the etchant can provide different etching rates applied to the first dielectric layer 216 during the etching process, and the needed profile of the opening O1/O2 can be achieved. A bottom B1/B2 of the opening O1/O2 is parallel to the top surface 2161 of the first dielectric layer 216, and at least a side S3/S4 of the opening O1/O2 is not perpendicular to the bottom B1/B2 of the opening O1/O2. In this exemplary embodiment, the etchant includes octafluorocyclobutane ($C_4F_8$), octafluorocyclopentene ($C_5F_8$), carbon monoxide (CO) and oxygen ($O_2$), and the gas ratio of octafluorocyclobutane ($C_4F_8$) to octafluorocyclopentene ($C_5F_8$) in the etchant is gradually changed, wherein a higher etching rate is applied to the first dielectric layer 216 in the prior stage of the etching process and a lower etching rate is applied to the first dielectric layer 216 in the last stages of the etching process. Accordingly, the formed openings O1/O2 may be barrel-shaped; in other words, a top width of the opening O1/O2 is substantially larger than a bottom width of the opening O1/O2, and at least a side S3/S4 of the opening O1/O2 is not perpendicular to the top surface 2161 of the first dielectric layer 216, i.e. the side S3/S4 of the opening O1/O2 is tilted. In other exemplary embodiment, the tilt degree of the side of the opening and the shape of the opening in the integrated circuit region 202 and in the seal ring region 204 could be different.

The openings O1/O2 in the first dielectric layer 216 may have different profiles according to the process requirements. Please refer to FIG. 4 again; when the etchant includes octafluorocyclobutane ($C_4F_8$), octafluorocyclopentene ($C_5F_8$), carbon monoxide (CO) and oxygen ($O_2$), the gas ratio in the etchant is adjusted to have a first gas ratio of octafluorocyclobutane ($C_4F_8$) to octafluorocyclopentene ($C_5F_8$) around a first specific period so as to provide a higher etching rate applied to the first dielectric layer 216 during the prior stages of the etching process. Additionally, the gas ratio in the etchant is further adjusted to have a second gas ratio of octafluorocyclobutane ($C_4F_8$) to octafluorocyclopentene ($C_5F_8$) around a second specific period so as to provide a lower etching rate applied to the first dielectric layer 216 in the last stages of the etching process. Accordingly, the tilted side S1 of the opening O including various tilt angles, as shown in FIG. 4, can be formed. The process conditions can also be modified to form a side of the opening having a plurality of tilt angles (more than two), and not limited as illustrated above.

Figure 8:
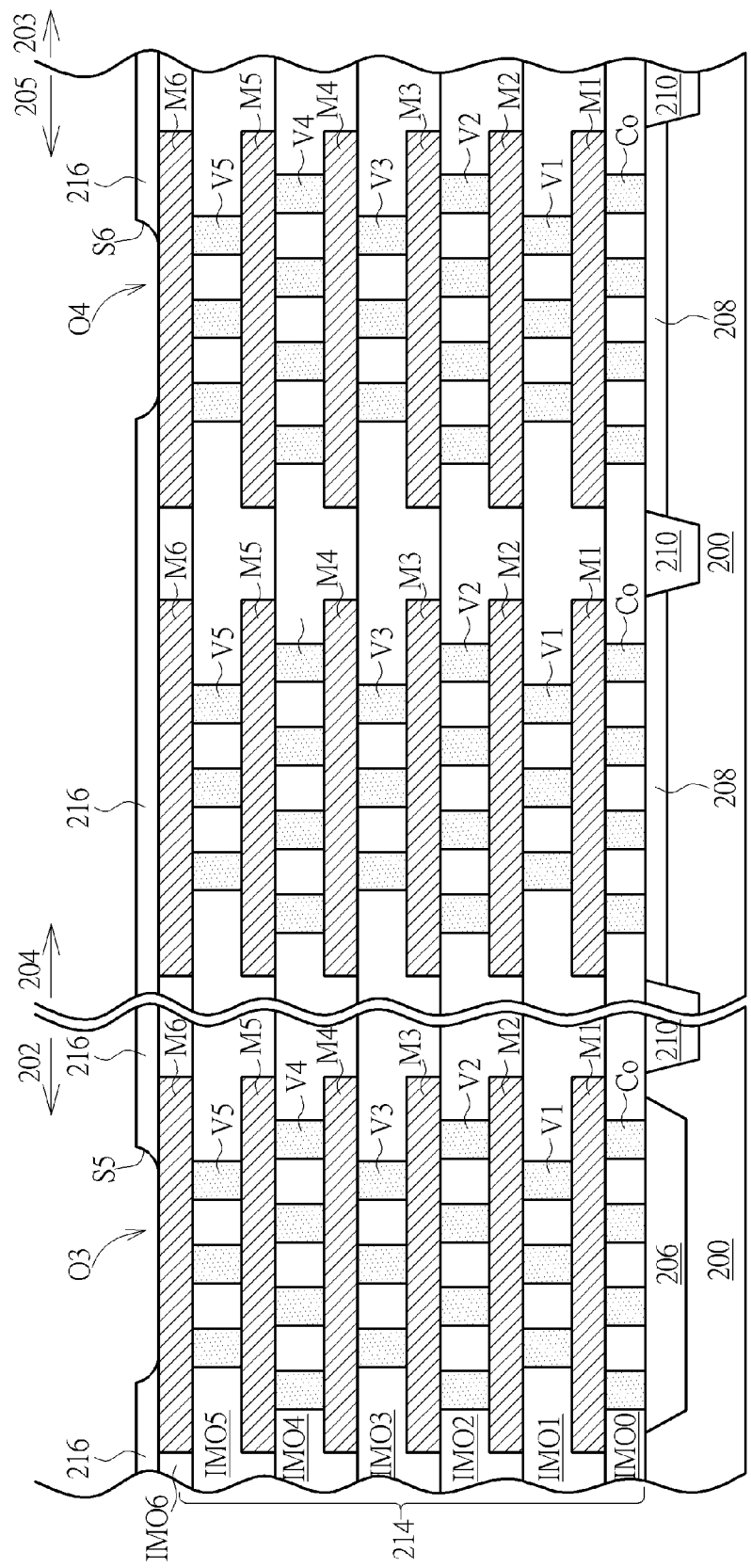

Moreover, as shown in FIG. 8, the etching process could be an isotropic etching process as well. Therefore, in addition to the first dielectric layer 216 not covered by the photoresist layer (i.e. the mask) that is removed, a part of the first dielectric layer 216 covered by the photoresist layer may also be removed due to lateral etching. Accordingly, after the implementation of the isotropic etching process, the concave-curved side S5/S6 of the opening O3/O4 can be formed. Additionally, the etching process may include different types of etching process, and due to the different characteristics of the different etching process types, the sides of the formed opening may have different values of curvature. Please refer to FIG. 5 again, wherein an isotropic etching process and an anisotropic etching process can be sequentially performed, for example, the thickness of the removed part of the first dielectric layer 216 by the isotropic etching process can be modulated by a time mode, such as adjusting the process conditions like the processing time of the isotropic etching process, so that the first dielectric layer 216 can be partially removed without being penetrated through. Subsequently, the anisotropic etching process is performed under the end point mode to totally remove the first dielectric layer 216 not covered by the photoresist layer until the top metal M6 of the metal stack 212 is exposed. Accordingly, the curved side S2 has at least two different values of curvature as shown in FIG. 5. The process conditions can also be modified to form a side of the opening having a plurality of curved sides having different values of curvature (more than two), and is not limited to that illustrated above.

Figure 9:
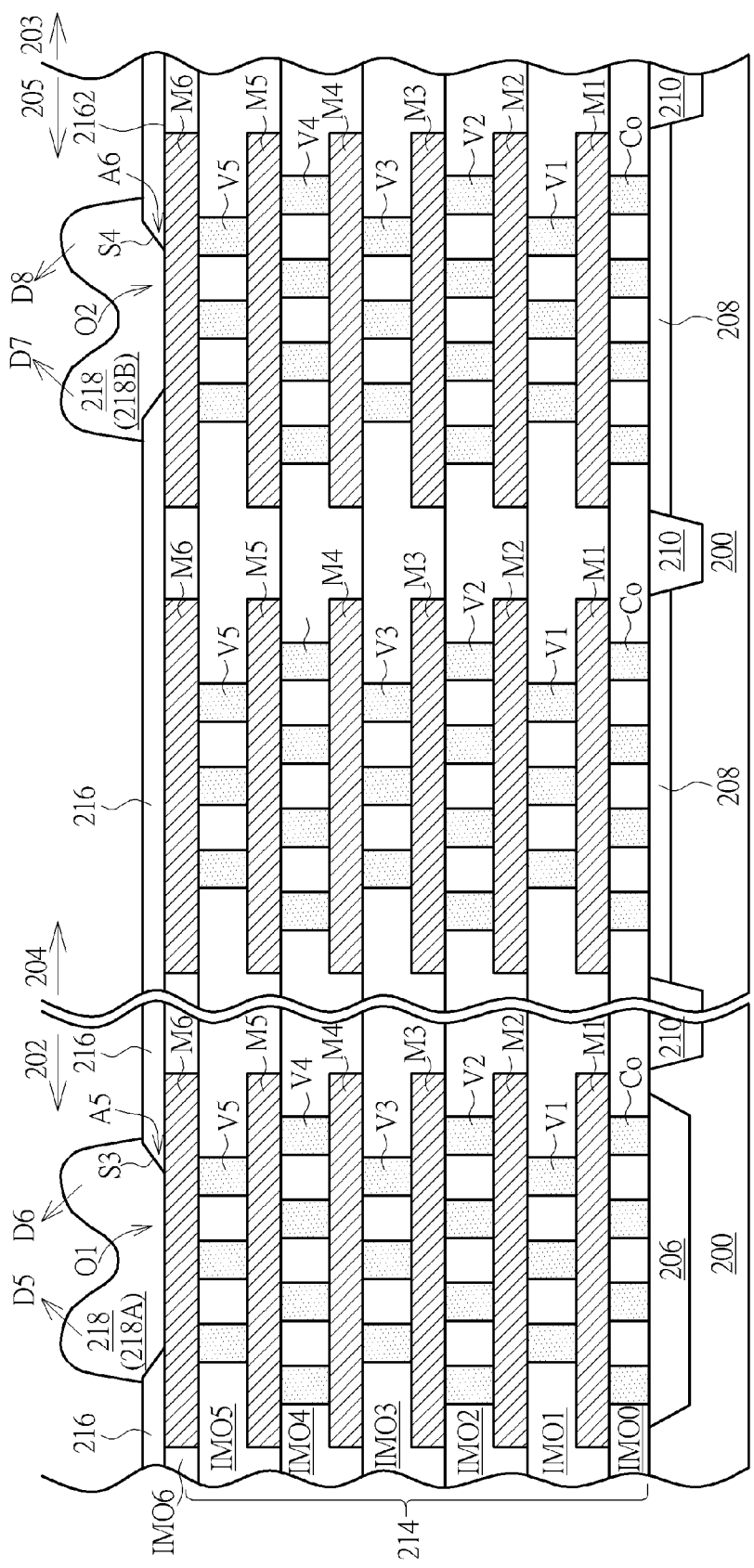

As shown in FIG. 9, a conductive material layer (not shown) could be conformally formed on the first dielectric layer 216 through a physical vapor deposition (PVD) process, such as a sputtering process and an evaporation process, a chemical vapor deposition (CVD) process, or other thin-film deposition processes, and a patterning process is subsequently performed on the conductive material layer to form a conductive layer 218 filling the openings O1/O2 in the integrated circuit region 202 and the seal ring region 204. The conductive material layer (i.e. the conductive layer 218) could be made of conductive material including opaque metal such as aluminum (Al), molybdenum (Mo), chromium (Cr), tungsten (W), copper (Cu) or any combination thereof, but not limited thereto, or other proper transparent conductive material. In this exemplary embodiment, the conductive layer 218 is made of aluminum (Al), the conductive layer 218A in the integrated circuit region 202 may serve as an interconnect or an input/output pad, and the conductive layer 218B in the seal ring region 204 may serve as a stress release pad to prevent the excessive stress generated during the die cutting process from transferring into the integrated circuit region 202. The sides S3/S4 of the openings O1/O2 may provide tilted sides instead of common vertical sides; therefore, no excess stress would accumulate at the upper corner where the conductive layer 218 contacts the first dielectric layer 216 when the conductive layer 218 covers the first dielectric layer 216. Furthermore, an included angle A5/A6 between the side S3/S4 and a bottom surface 2162 of the first dielectric layer 216 could be substantially equal to or smaller than 90 degrees, and preferably ranges between 85 and 90 degrees. The conductive layer 218A/218B filling the opening O1/O2 may include two convex-curved parts toward different directions D5/D6/D7/D8 above the first dielectric layer 216 instead of common vertical corners. The protruding directions D5/D6 D7/D8 of the two convex-curved parts in each conductive layer 218A/218B are not toward the substrate 200 and not parallel to each other, in order to avoid the formation of the overhang during the formation in each conductive layer 218A/218B which may cause void defect within the conductive layer 218.

Figure 10:
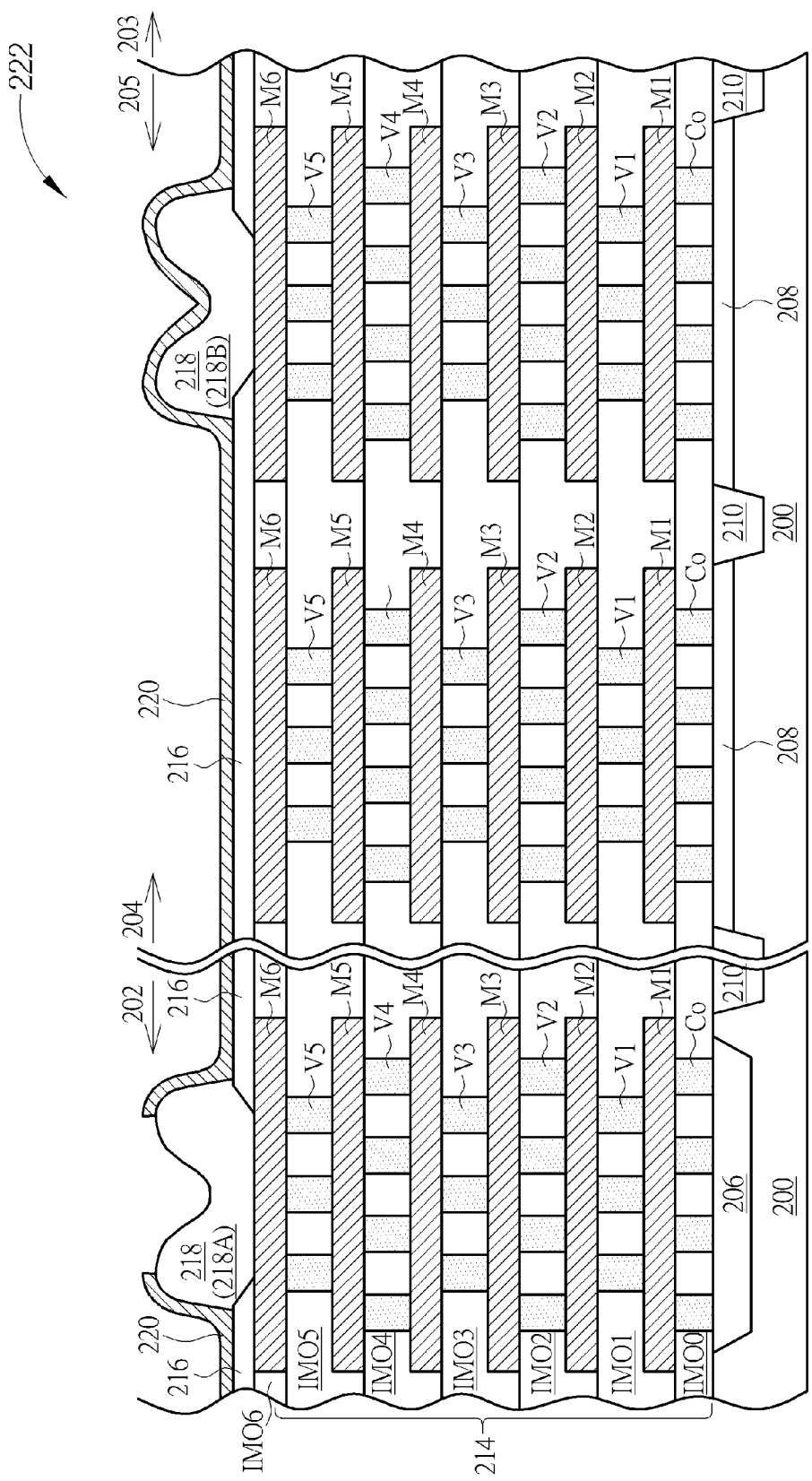

As shown in FIG. 10, a dielectric material layer (not shown) could be conformally formed on the conductive layer 218 through a chemical vapor deposition (CVD) process, or other thin-film deposition process, and a patterning process is subsequently performed on the dielectric material layer to form a second dielectric layer 220. The second dielectric layer 220 may include a single-layered structure or a multi-layered structure, and a thickness of the second dielectric layer 220 is substantially smaller than the thickness of the first dielectric layer 216. The material of the second dielectric layer 220 includes dielectric material such as silicon oxide (SiO), silicon nitride (SiN), silicon oxynitride (SiON) or a combination thereof. In this exemplary embodiment, the second dielectric layer 220 includes a multi-layered structure made of silicon oxide (SiO) and silicon nitride (SiN). The second dielectric layer 220 partially exposes the conductive layer 218A in the integrated circuit region 202, and continuously covers the first dielectric layer 216 and the conductive layer 218B in the seal ring region 204. More specifically, the second dielectric layer 220 has a v-shaped surface totally overlapping the conductive layer 218B to serve as the passivation layer in the seal ring region 204. Accordingly, the seal ring structure 222 is completed.

Afterwards, related processes of wafer-level chip scale packaging (WLCSP) technology could be further performed to form the solder bumps (not shown) electrically connected to the conductive layer 218A in the integrated circuit region 202, and the conductive layer 218B is still covered by the second dielectric layer 220 in the seal ring region 204 to prevent the formed seal ring structure 222 from being damaged by the WLCSP processes such as under bump metallurgy (UBM) layer processes or the redistribution layer (RDL) processes.

Figure 11:
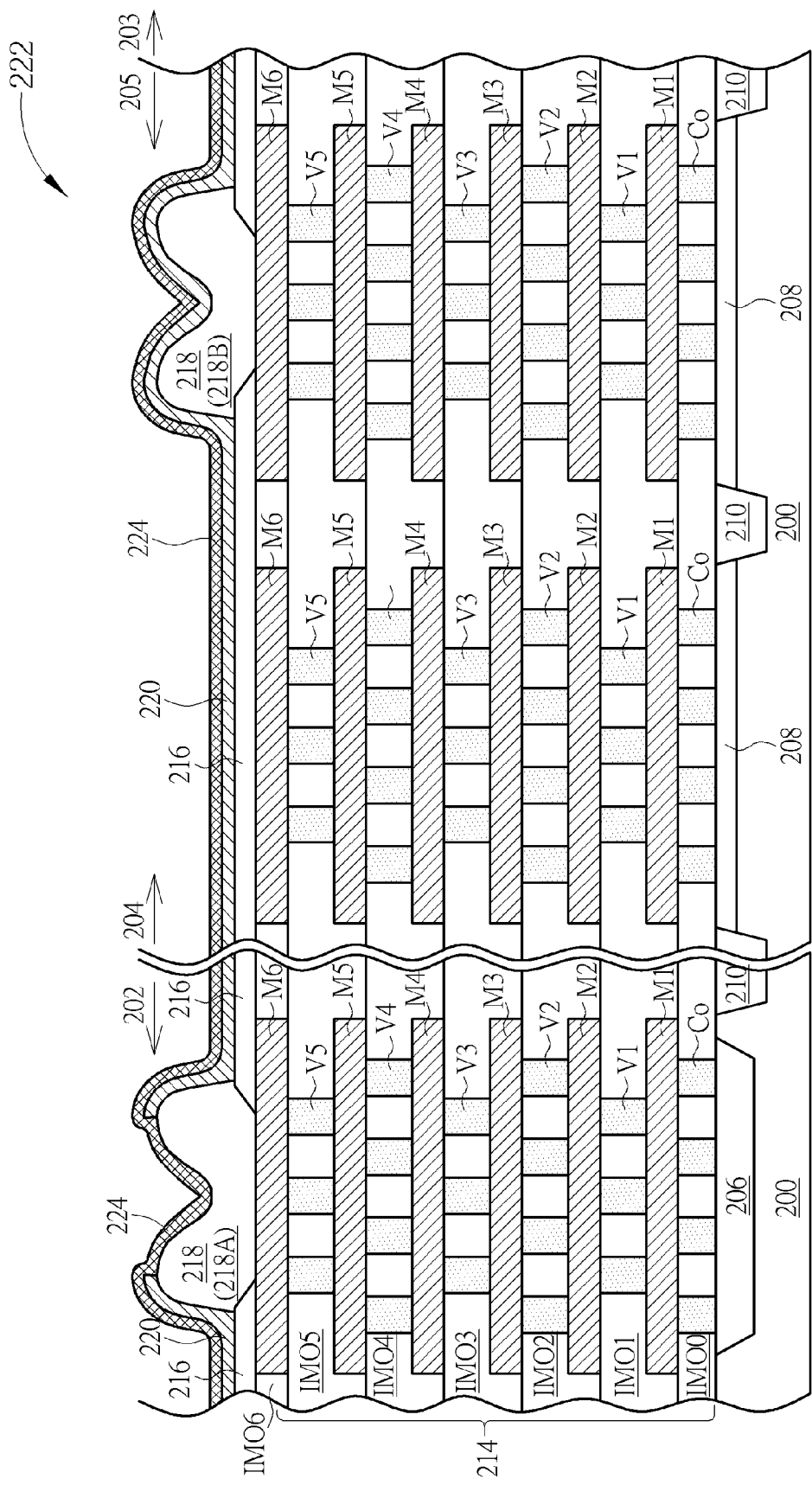

It is appreciated that, as shown in FIG. 11, as a redistribution layer (RDL) 224, for example, made of Ti/Cu alloy, is formed on the second dielectric layer 220 through a sputtering process, and the continuous surface in the seal ring region 204 facilitates the thickness uniformity of the redistribution layer (RDL) 224. As shown in Table. 1, after overall forming the redistribution layer (RDL) on the test wafer, the thickness distribution of the redistribution layer (RDL) does not meet the RDL thickness specification, 8+/−1 micrometers (μm) as the dies of the test wafer include the seal ring structures according to the first exemplary embodiment as shown in FIG. 1. Conversely, the thickness distribution of the redistribution layer (RDL) is compatible to the RDL specification, as the dies of the test wafer include the seal ring structures according to the second exemplary embodiment of the present invention as shown in FIG. 3.

TABLE 1

| RDL Thickness (μm) | | | | | |
|---|---|---|---|---|---|
| The first exemplary embodiment | | | The second exemplary embodiment | | |
| Edge | Middle | Center | Edge | Middle | Center |
| 15.52 | 5.05 | 3.5 | 8.06 | 8.24 | 8.42 |

In conclusion, during the etching processes performed to remove a part of the first dielectric layer to form the opening, a gas ratio of the etchant is modified to optimize the profile of the opening. Therefore, at least a side of the opening is tilted or includes a concave-curved side. In other words, a width of the opening may increase from a bottom to a top of the opening. Furthermore, the conductive layer filling the opening may include two convex-curved parts toward different directions above the first dielectric layer instead of common vertical corners. The second dielectric layer may conformally cover the conductive layer and induce a v-shaped surface just on the conductive layer. Consequently, the overhang defect can be avoided, the coverage rate of the second dielectric layer and the thickness uniformity of the film later formed by sputtering process can be further improved, and the completeness of the seal ring structure can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A seal ring structure, comprising:
at least a metal stack, a first dielectric layer, a conductive layer and a second dielectric layer sequentially disposed in a seal ring region of a substrate, wherein at least a side between the first dielectric layer and the conductive layer is not perpendicular to a top surface of the first dielectric layer, the second dielectric layer comprises a v-shaped surface, the top surface of the second dielectric layer is exposed, and the second dielectric layer directly contacting and totally overlapping all of the conductive layer.

2. The seal ring structure according to claim 1, wherein the side between the first dielectric layer and the conductive layer is tilted.

3. The seal ring structure according to claim 2, wherein the side between the first dielectric layer and the conductive layer comprises various tilt angles.

4. The seal ring structure according to claim 1, wherein the side between the first dielectric layer and the conductive layer comprises a concave-curved side.

5. The seal ring structure according to claim 4, wherein the side between the first dielectric layer and the conductive layer has at least two different values of curvature.

6. The seal ring structure according to claim 5, wherein the side between the first dielectric layer and the conductive layer comprises at least an upper side and at least a lower side, and a curvature of the upper side is substantially larger than a curvature of the lower side.

7. The seal ring structure according to claim 1, wherein a thickness of the first dielectric layer is substantially smaller than 10000 Angstroms (Å).

8. A seal ring structure, comprising:
at least a metal stack, a first dielectric layer, a conductive layer and a second dielectric layer sequentially disposed in a seal ring region of a substrate, wherein at least a side between the first dielectric layer and the conductive layer is not perpendicular to a top surface of the first dielectric layer, the second dielectric layer comprises a v-shaped surface, the second dielectric layer directly contacting and totally overlapping the conductive layer, the metal stack includes a plurality of metal layers, and the conductive layer in the seal ring region serve as a stress release pad.

\* \* \* \* \*